US010645821B1

(12) United States Patent
Cheng (10) Patent No.: US 10,645,821 B1
(45) Date of Patent: May 5, 2020

(54) HOUSING STRUCTURE

(71) Applicant: CHICONY POWER TECHNOLOGY CO., LTD., New Taipei (TW)

(72) Inventor: Chao-Cheng Cheng, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/390,864

(22) Filed: Apr. 22, 2019

(30) Foreign Application Priority Data

Mar. 19, 2019 (TW) .............................. 108109426 A (51) Int. Cl.
*H05K 5/02* (2006.01)
*H05K 5/00* (2006.01)
*H01R 13/516* (2006.01)

(52) U.S. Cl.
CPC ......... *H05K 5/0004* (2013.01); *H01R 13/516* (2013.01); *H05K 5/0217* (2013.01)

(58) Field of Classification Search
CPC .. H05K 5/0004; H05K 5/0217; H05K 5/0047; H05K 5/0052; H05K 5/0221; H05K 5/0226; H05K 5/0208; H05K 5/03; H01R 13/516; H01R 13/627; H01R 13/6271; H01R 24/20; H01R 23/025; H01R 13/658; H01R 13/6658; H01R 13/506
See application file for complete search history.

(56) References Cited

U.S. PATENT DOCUMENTS

| | | | | |
|---|---|---|---|---|
| 4,969,830 A | * | 11/1990 | Daly ..................... | G06F 1/1632 200/50.1 |
| 5,437,564 A | * | 8/1995 | Lignelet ............... | H01R 13/514 439/701 |
| 5,526,227 A | * | 6/1996 | Satou .................... | G06F 1/1616 361/679.32 |
| 6,080,003 A | * | 6/2000 | Tamura ................ | H05K 5/0021 439/347 |

(Continued)

FOREIGN PATENT DOCUMENTS

| | | |
|---|---|---|
| CN | 2520594 Y | 11/2002 |
| CN | 2669285 Y | 1/2005 |

(Continued)

*Primary Examiner* — Edwin A. Leon
*Assistant Examiner* — Milagros Jeancharles
(74) *Attorney, Agent, or Firm* — Muncy, Geissler, Olds & Lowe, P.C.

(57) ABSTRACT

A housing structure includes a connector, a first housing, and a second housing. The first housing includes a first cover board, a first sideboard, two second sideboards, first recesses, and bumps. The first sideboard is connected to the first cover board. The connector is exposed from the first sideboard. The second sideboards are connected to the first cover board and the first sideboard. The first recesses are disposed aside the second sideboards. The bumps are disposed in the first recesses, respectively. There are gaps between the bumps and the first recesses. The second housing includes a second cover board, two third sideboards, a first connect board, and connect hooks. The third sideboards are connected to the second cover board. The first connect board is disposed on the second cover board and (Continued)

contacts against the connector. The connect hooks are protruded from the third sideboards for engaging with the bumps.

15 Claims, 6 Drawing Sheets

(56) References Cited

U.S. PATENT DOCUMENTS

| | | | | |
|---|---|---|---|---|
| 6,168,476 B1* | 1/2001 | Yang | ............... | H01R 13/506 |
| | | | | 439/352 |
| 6,366,471 B1* | 4/2002 | Edwards | ............ | H01R 12/7058 |
| | | | | 361/753 |
| 6,381,138 B1* | 4/2002 | Chen | ............... | G06F 1/181 |
| | | | | 312/223.2 |
| 6,492,590 B1* | 12/2002 | Cheng | ............... | H01F 27/04 |
| | | | | 174/50 |
| 9,214,770 B2* | 12/2015 | Lee | ............... | H01R 24/28 |
| 9,426,917 B2* | 8/2016 | Hsu | ............... | H05K 7/1061 |
| 10,148,074 B1* | 12/2018 | Matsumura | ............ | H02G 3/083 |
| 2005/0013095 A1* | 1/2005 | Oda | ............... | H01R 9/226 |
| | | | | 361/601 |
| 2005/0079891 A1* | 4/2005 | Lee | ............... | H04B 1/3816 |
| | | | | 455/558 |
| 2005/0186846 A1* | 8/2005 | Wu | ............... | H01R 9/032 |
| | | | | 439/607.56 |
| 2007/0293078 A1* | 12/2007 | Lu | ............... | H01R 13/627 |
| | | | | 439/347 |
| 2010/0062323 A1* | 3/2010 | Dong | ............... | H01M 2/1066 |
| | | | | 429/96 |
| 2010/0093218 A1* | 4/2010 | Zhang | ............... | H01R 13/6658 |
| | | | | 439/607.45 |
| 2011/0111629 A1* | 5/2011 | Peng | ............... | H01R 13/518 |
| | | | | 439/607.35 |
| 2015/0296636 A1* | 10/2015 | Wang | ............... | H05K 7/1432 |
| | | | | 361/736 |
| 2015/0305184 A1* | 10/2015 | Tokumasu | ............ | H05K 5/0221 |
| | | | | 312/223.1 |
| 2017/0290183 A1 | 10/2017 | Lee et al. | | |

FOREIGN PATENT DOCUMENTS

| | | |
|---|---|---|
| CN | 2735716 Y | 10/2005 |
| CN | 201112517 Y | 9/2008 |
| CN | 202111963 U | 1/2012 |
| CN | 103582326 A | 2/2014 |
| TW | M244616 | 9/2004 |
| TW | 201118893 A | 6/2011 |
| TW | I422309 | 1/2014 |
| TW | M492033 | 12/2014 |
| TW | M497407 | 3/2015 |
| TW | M502935 | 6/2015 |

* cited by examiner

HOUSING STRUCTURE

CROSS REFERENCE TO RELATED APPLICATIONS

This Non-provisional application claims priority under 35 U.S.C. § 119(a) on Patent Application No(s). 108109426 filed in Taiwan, Republic of China on Mar. 19, 2019, the entire contents of which are hereby incorporated by reference.

BACKGROUND

Technology Field

The present disclosure relates to a housing structure and, in particular, to a housing structure that can be easily assembled, suitable for connecting and fixing a connector, and tightly connected together.

Description of Related Art

In the conventional assembling method, two housings (e.g. the upper housing and the lower housing of an electronic product) can be connected by screws, connecting structures, or ultrasonic welding. However, the additional tool (e.g. a screwdriver) is needed to assembling two housings by screws, and the connecting status and quality of the screws cannot be easily controlled. This approach may decrease the production speed and quality and increase the production cost. Besides, the general connecting structures usually comprise the recesses on the first housing and the connect hooks on the second housing. Although this design can connect two separated housings, it is also easy to detach the two housings by applying opposite forces. Moreover, the ultrasonic welding process still has the risk of failure, which can result in decreased production yield.

Therefore, it is an important subject to provide a housing structure that can firmly connect two housings and maintain the connecting status under external forces.

SUMMARY

An objective of this disclosure is to provide a housing structure that can maintain the connecting status under external forces, thereby preventing the detachment of the housings. Compared with the conventional art, this disclosure does not need to fix the housings by other approaches (e.g. ultrasonic welding or screwing), can easily assemble the housings, and can save the production cost.

The present disclosure provides a housing structure comprises a connector, a first housing and a second housing. The first housing comprises a first cover board, a first sideboard, two second sideboards, a plurality of first recesses, and a plurality of bumps. The first sideboard is connected to the first cover board, and the connector is exposed from the first sideboard. The two second sideboards are connected to the first cover board and two ends of the first sideboard. The first recesses are disposed at sides of the second sideboards away from the first cover board. The bumps are disposed in the first recesses, respectively. A gap is formed between each bump and a side wall of the corresponding first recess closest to the first cover board. The second housing comprises a second cover board, two third sideboards, a first connect board and a plurality of connect hooks. The two third sideboards are connected to the second cover board and corresponding to the second sideboards. The first connect board is disposed on the second cover board and contacts against an end of the connector away from the first sideboard. The connect hooks are protruded from one sides of the third sideboards away from the second cover board for engaging with the bumps.

In one embodiment, each of the connect hooks comprises a connecting portion and a boot portion, one end of each of the connecting portions is connected to each of the third sideboards, and the other end of each of the connecting portions is connected to each of the boot portions, an opening is formed between each of the boot portions and the side of the third sideboard away from the second cover board, the boot portions are disposed corresponding to the gaps, and the openings are disposed along a direction away from the first sideboard.

In one embodiment, each of the boot portions has a first width, each of the openings has a second width, the first width is equal to a width of the gap, and the second width is equal to a width of each of the bumps.

In one embodiment, the second housing further comprises a second connect board disposed on the second cover board and contacting against one end of the connector away from the first sideboard.

In one embodiment, the first connect board has a first stop portion, the second connect board has a second stop portion, and the first connect board and the second connect board contact against one end of the connector away from the first sideboard by the first stop portion and the second stop portion.

In one embodiment, a third width is defined between the first stop portion and the second stop portion, and the third width is less than a width of the connector.

In one embodiment, the first housing comprises a fixing base connecting to the first sideboard and the first cover board and disposed corresponding to the connector.

In one embodiment, the connector has a connect rail disposed around a surface of the connector, and the first sideboard has a connect slot disposed corresponding to the connect rail.

In one embodiment, the first sideboard has at least one first connect hole, the second cover board has at least one first connect block, and the at least one first connect block is disposed corresponding to the at least one first connect hole.

In one embodiment, the first housing further comprises an output sideboard connected to the first cover board, each of the second sideboards has a coupling board coupling to two ends of the output sideboard, each of the coupling board comprises a second connect hole, each of the third sideboard has a second recess disposed corresponding to the coupling board, and each of the second recesses has a second connect block disposed corresponding to each of the second connect hole.

In one embodiment, the output sideboard has a top surface, at least one third connect block is disposed on the top surface, the second cover board has a connect groove disposed corresponding to the top surface, and the connect groove is configured to accommodate the at least one third connect block.

In one embodiment, the second cover board further comprises at least one contact block disposed corresponding to the output sideboard, and the at least one contact block contacts against the output sideboard.

As mentioned above, the housing structure of this disclosure can maintain the connecting status under external forces, thereby preventing the detachment of the housings. In addition, this disclosure does not need to fix the housings by other approaches (e.g. ultrasonic welding or screwing), can easily assemble the housings, and can save the production cost.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

The housing structure of this disclosure can maintain the connecting status under external forces, thereby firmly connecting two housing and preventing the detachment of the housings. In addition, this disclosure does not need to fix the housings by other approaches (e.g. ultrasonic welding or screwing), can easily assemble the housings, and can save the production cost.

Figure 1A:
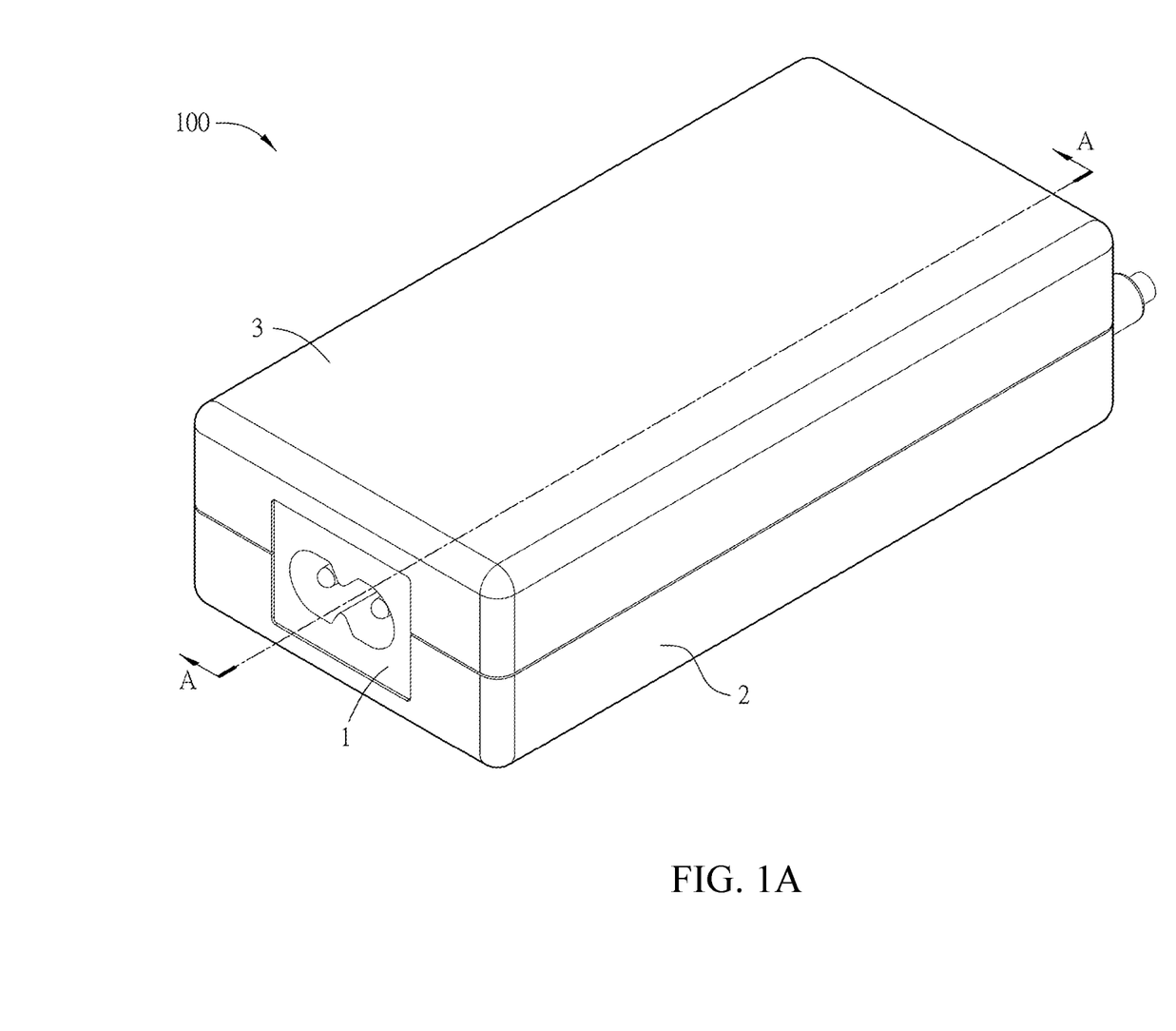
FIG. 1A is a schematic diagram showing a housing structure according to an embodiment of this disclosure.
Figure 1B:
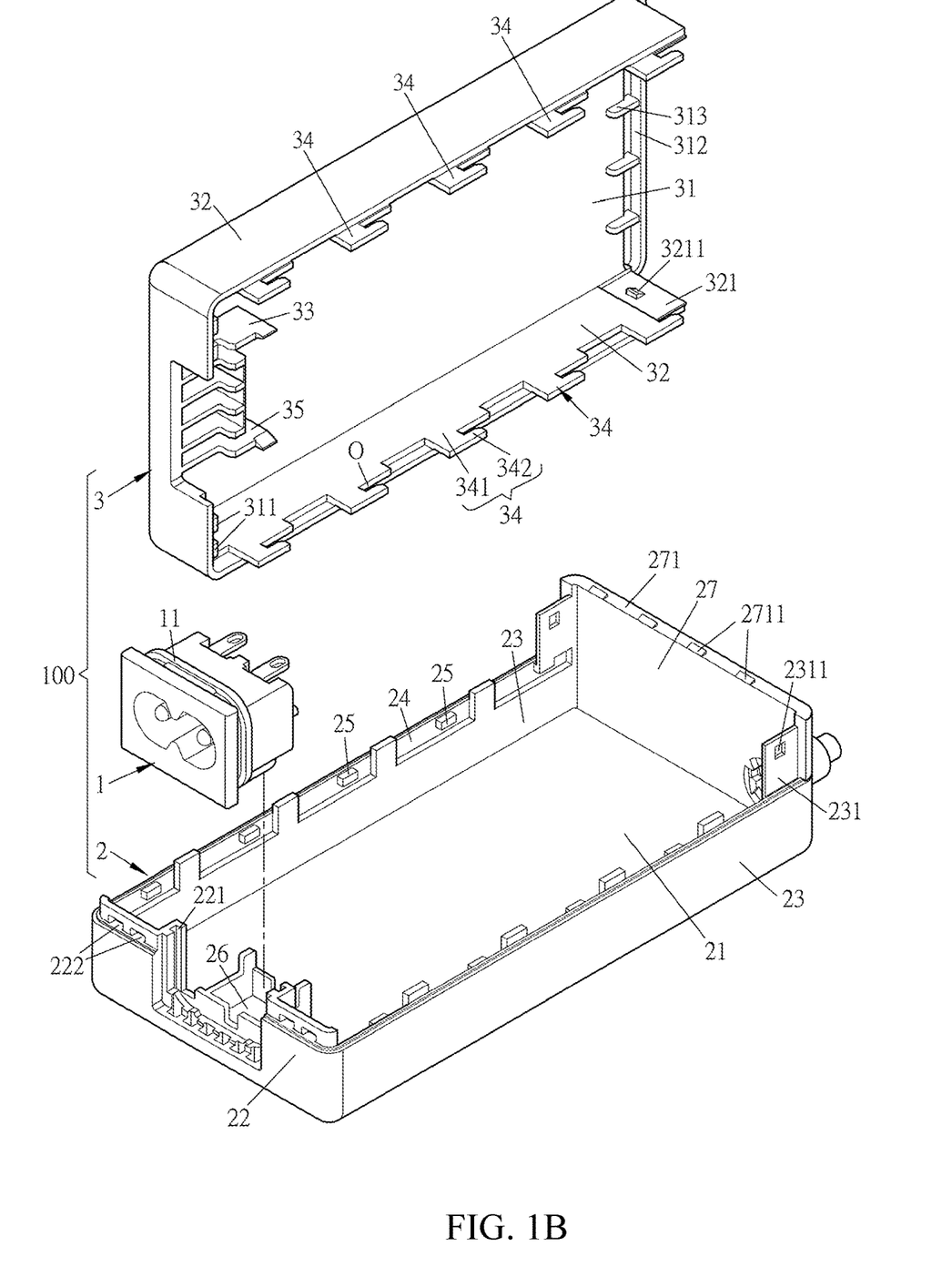
FIG. 1B is an exploded view of the housing structure of FIG. 1A.

FIG. 1A is a schematic diagram showing a housing structure according to an embodiment of this disclosure, and FIG. 1B is an exploded view of the housing structure of FIG. 1A. As shown in FIGS. 1A and 1B, the housing structure 100 of this disclosure comprises a connector 1, a first housing 2, and a second housing 3. To be noted, the connector 1 of this embodiment is, for example, a power connector. However, the connector 1 can also be a fiber connector, a memory connector, a light connector, a back plate connector, a firewall connector, or any of other known connectors, and this disclosure is not limited thereto.

Figure 2A:
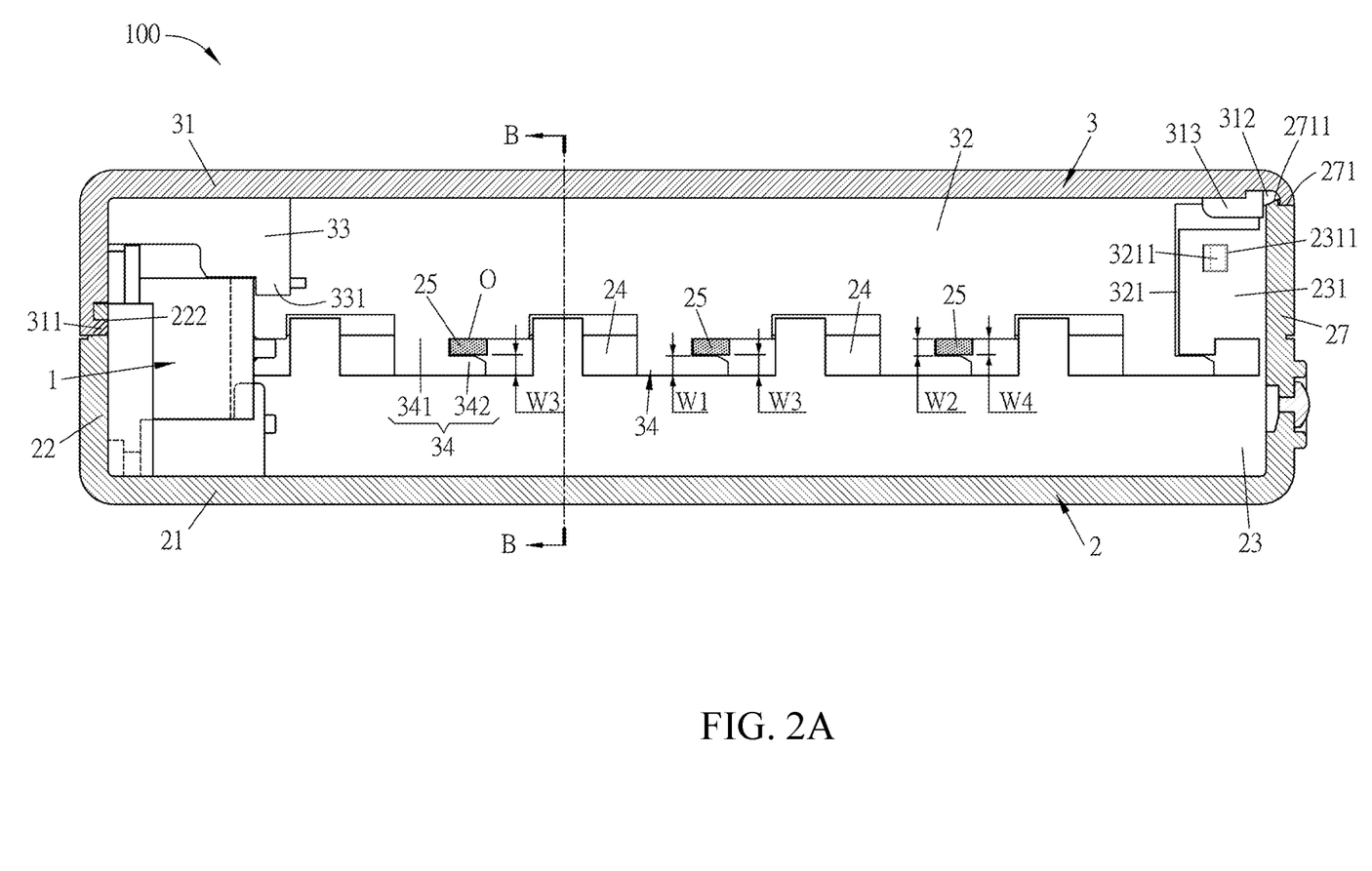
FIG. 2A is a sectional view of the housing structure of FIG. 1A along the line A-A, wherein the housing structure is assembled.
Figure 2B:
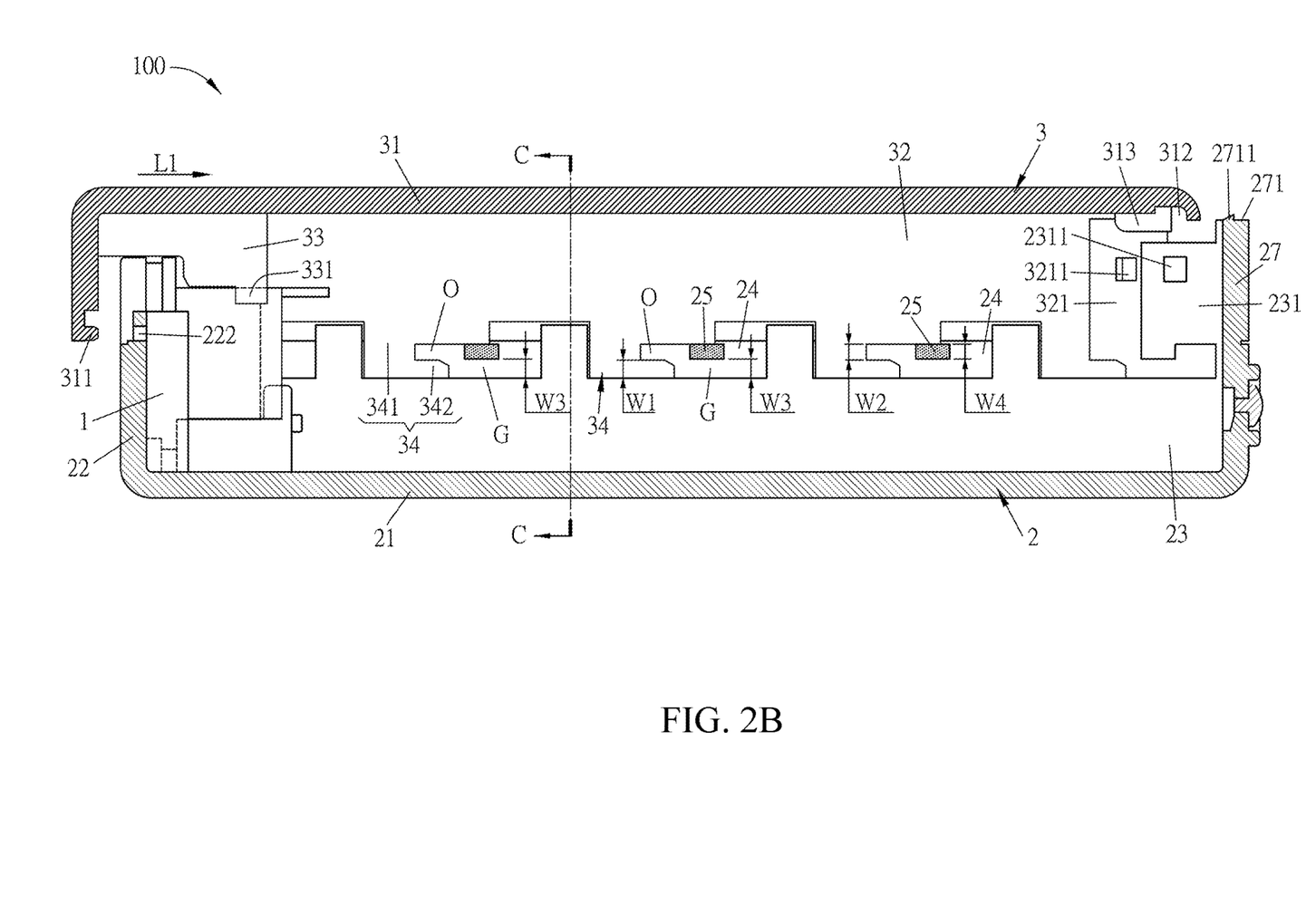
FIG. 2B is a sectional view of the housing structure as shown in FIG. 1A, wherein the housing structure is not assembled.

FIG. 2A is a sectional view of the housing structure of FIG. 1A along the line A-A, wherein the housing structure is assembled, and FIG. 2B is a sectional view of the housing structure as shown in FIG. 1A, wherein the housing structure is not assembled. Referring to FIGS. 1B, 2A and 2B, the first housing 2 comprises a first cover board 21, a first sideboard 22, two second sideboards 23, a plurality of first recesses 24, and a plurality of bumps 25. The first sideboard 22 is connected to the first cover board 21, and the connector 1 is exposed from the first sideboard 22. The two second sideboards 23 are connected to the first cover board 21, and the two second sideboards 23 are connected to two ends of the first sideboard 22, respectively. The first recesses 24 are disposed at the sides of the second sideboards 23 away from the first cover board 21. The bumps 25 are disposed in the first recesses 24, respectively. A gap G is formed between each bump 25 and a side wall of the corresponding first recess 24 closest to the first cover board 21.

In this embodiment, the second housing 3 comprises a second cover board 31, two third sideboards 32, a first connect board 33, and a plurality of connect hooks 34. The two third sideboards 32 are connected to the second cover board 31 and disposed corresponding to the second sideboards 23. The first connect board 33 is disposed on the second cover board 31 and contacts against an end of the connector 1 away from the first sideboard 22. The connect hooks 34 are protruded from one sides of the third sideboards 32 away from the second cover board 31 for engaging with the bumps 25. In more detailed, as shown in FIG. 2A, the first connect board 33 of the second housing 3 contacts against one end of the connector 1 away from the first sideboard 22 for restricting the displacement of the second housing 3 toward the left side of the figure. The connect hooks 34 of the second housing 3 can engage with the bumps 25 of the first housing 2, respectively, for restricting the displacements of the second housing 3 toward the right, up and down sides of the figure.

In this embodiment, each of the connect hooks 34 comprises a connecting portion 341 and a boot portion 342. One end of each connecting portion 341 is connected to each third sideboards 32, and the other end of each connecting portion 341 is connected to each boot portion 342. An opening O is formed between each of the boot portions 342 and the side of the third sideboard 32 away from the second cover board 31. The boot portions 342 are disposed corresponding to the gaps G, and the openings O are disposed along a direction away from the first sideboard 22.

In this embodiment, each of the boot portions 342 has a first width W1, and each of the openings O has a second width W2. The first width W1 is equal to a width W3 of the gap G, and the second width W2 is equal to a width W4 of each of the bumps 25. Specifically, as shown in FIG. 2B, the first width W1 of the boot portion 342 of the second housing 3 is equal to the width W3 of the gap G of the first housing 2, and the second width W2 of the opening O of the second housing 3 is equal to the width W4 of the bump 25 of the first housing 2. Accordingly, after the second housing 3 is moved toward the right of the figure to a specific position (as the direction of arrow L1), the boot portions 342 are located corresponding to the gaps G, and the openings O are located corresponding to the bumps 25. Thus, the connect hooks 34 can engage with the bumps 25 as shown in FIG. 2A.

Figure 3A:
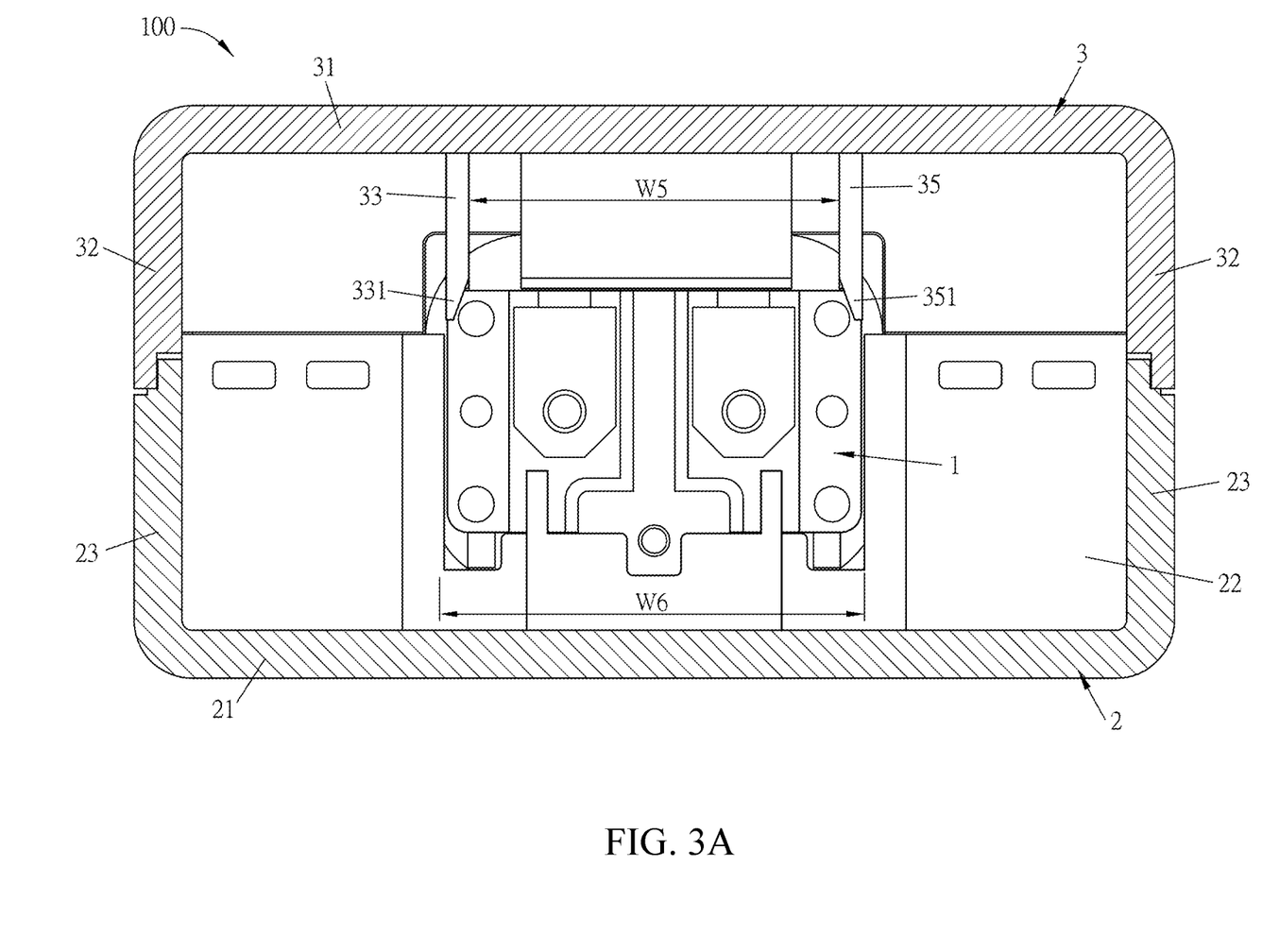
FIG. 3A is a sectional view of the housing structure of FIG. 2A along the line B-B.
Figure 3B:
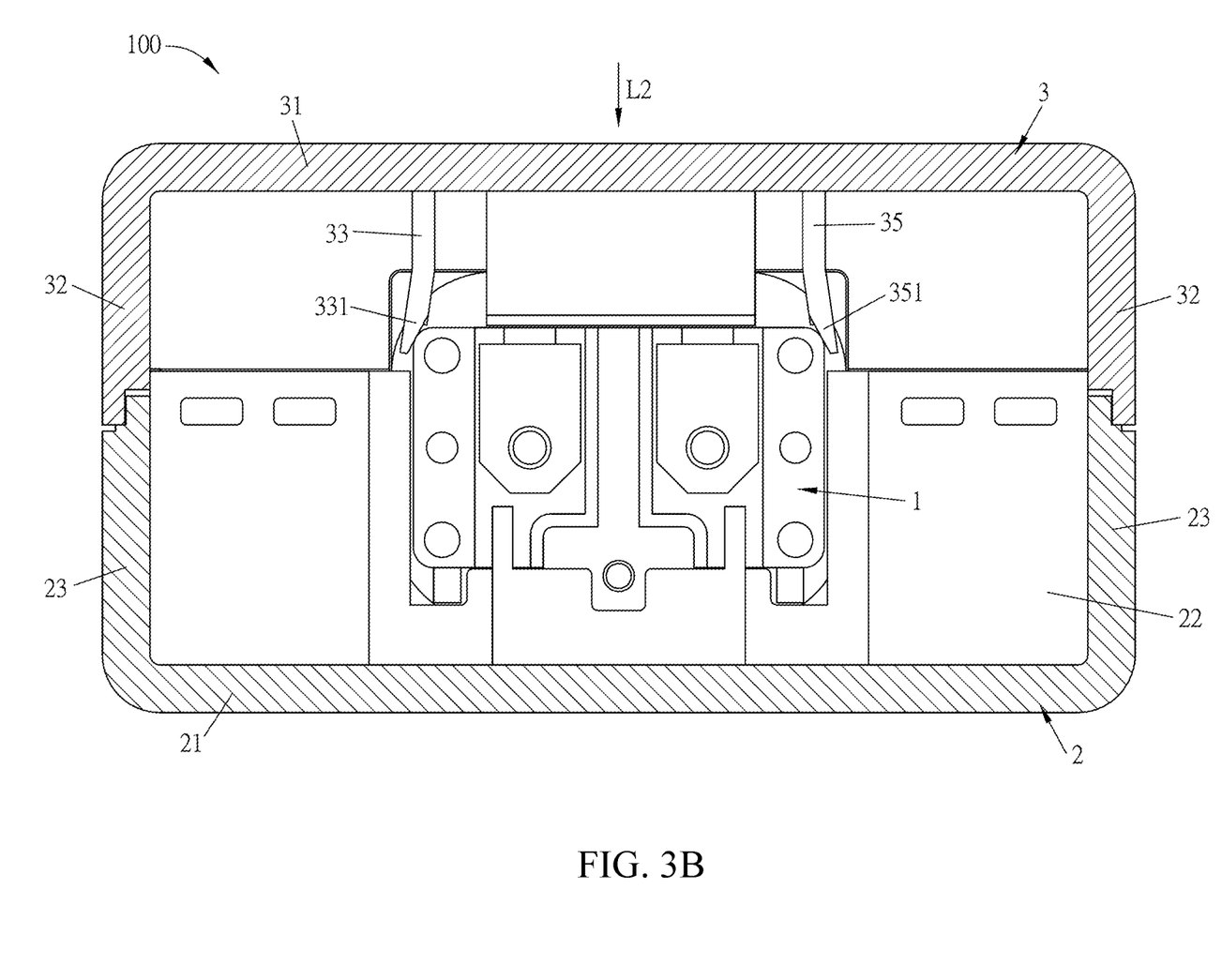
FIG. 3B is a sectional view of the housing structure of FIG. 2B along the line C-C.

FIG. 3A is a sectional view of the housing structure of FIG. 2A along the line B-B, and FIG. 3B is a sectional view of the housing structure of FIG. 2B along the line C-C. Referring to FIGS. 1B, and 3A to 3B, the second housing 3 further comprises a second connect board 35 disposed on the second cover board 31 and contacting against one end of the connector 1 away from the first sideboard 22. Specifically, the second connect board 35 of the second housing 3 contacts against one end of the connector 1 away from the first sideboard 22 for restricting the displacement of the second housing 3 toward the first sideboard 22.

In this embodiment, the first connect board 33 has a first stop portion 331, and the second connect board 35 has a second stop portion 351. The first connect board 33 and the second connect board 35 contact against one end of the connector 1 away from the first sideboard 22 by the first stop portion 331 and the second stop portion 351. Specifically, the first stop portion 331 of the first connect board 33 and the second stop portion 351 of the second connect board 35 contact against one end of the connector 1 away from the first sideboard 22 for restricting the displacement of the second housing 3 toward the first sideboard 22.

In this embodiment, a third width W5 is defined between the first stop portion 331 and the second stop portion 351, and the third width W5 is less than a width W6 of the connector 1. In more detailed, as shown in FIGS. 3A and 3B, since the third width W5 between the first stop portion 331 of the first connect board 33 and the second stop portion 351 of the second connect board 35 is less than the width W6 of the connector 1, the first stop portion 331 and the second stop portion 351 can have deformation when the second housing 3 moves toward the connector 1 along the direction of the arrow L2 and the first stop portion 331 and the second stop portion 351 contact against one end of the connector 1 facing the second cover board 31. This design can make the second housing 3 closer to the first housing 2 so as to form the status of FIG. 2B. Next, as shown in FIGS. 2A and 3A, when the second housing 3 is disposed corresponding to the first housing 2, the first stop portion 331 of the first connect board 33 and the second stop portion 351 of the second connect board 35 can contact against one end of the connector 1 away from the first sideboard 22, and the third width W5 between the first stop portion 331 of the first connect board 33 and the second stop portion 351 of the second connect board 35 is less than the width W6 of the connector 1. Accordingly, the first connect board 33 and the second connect board 35 of the second housing 3 cannot be moved toward the left side of FIG. 2A anymore.

Referring to FIG. 11B, in this embodiment, the first housing 2 comprises a fixing base 26 connecting to the first sideboard 22 and the first cover board 21, and the fixing base 26 is disposed corresponding to the connector 1. Specifically, the fixing base 26 can be used to fix the connector 1.

In this embodiment, the connector 1 has a connect rail 11 disposed around a surface of the connector 1, and the first sideboard 22 has a connect slot 221 disposed corresponding to the connect rail 11. Specifically, the connect rail 11 and the connect slot 221 are configured to fix the relative positions of the connector 1 and the first sideboard 22.

Referring to FIGS. 1B, 2A and 2B, in this embodiment, the first sideboard 22 has at least one first connect hole 222, and the second cover board 31 has at least one first connect block 311. The at least one first connect block 311 is disposed corresponding to the at least one first connect hole 222. Specifically, the design of the first connect block 311 of the second housing 3 and the first connect hole 222 of the first housing 2, which can engage with each other, can restrict the displacements of the second housing 3 toward the right, up and down sides of the figure.

In this embodiment, the first housing 2 further comprises an output sideboard 27 connected to the first cover board 21, and each of the second sideboards 23 has a coupling board 231 coupling to two ends of the output sideboard 27. Each of the coupling board 231 comprises a second connect hole 2311, and each of the third sideboard 32 has a second recess 321 disposed corresponding to the coupling board 231. Each of the second recesses 321 has a second connect block 3211 disposed corresponding to each of the second connect hole 2311. Specifically, the second connect blocks 3211 of the second housing 3 can engage with the corresponding second connect holes 2311 of the first housing 2, and this design can restrict the displacements of the second housing 3 toward the left, right, up and down sides of the figure.

In this embodiment, the output sideboard 27 has a top surface 271, and at least one third connect block 2711 is disposed on the top surface 271. The second cover board 31 has a connect groove 312 disposed corresponding to the top surface 271, and the connect groove 312 is configured to accommodate the at least one third connect block 2711. Specifically, the connect groove 312 of the second housing 3 can engage with the corresponding third connect block 2711 of the first housing 2, and this design can restrict the displacements of the second housing 3 toward the left and down sides of the figure.

In this embodiment, the second cover board 31 further comprises at least one contact block 313 disposed corresponding to the output sideboard 27, and the at least one contact block 313 contacts against the output sideboard 27. Specifically, the contact block 313 of the second housing 3 can engage with the corresponding output sideboard 27 of the first housing 2, and this design can restrict the displacements of the second housing 3 toward the right side of the figure.

The assembling procedure of the housing structure 100 will be described hereinafter with reference to FIGS. 1A to 3B. First, as shown in FIG. 1B, the connector 1 is disposed corresponding to the first housing 2. Specifically, the connector 1 can be disposed on the first housing 2 by the fixing base 26 and the connect slot 221 of the first side board 22 of the first housing 2. The connect rail 11 of the connector 1 is disposed corresponding to the connect slot 221 of the first sideboard 22, and one side of the connector 1 is exposed from the first sideboard 22 (see FIG. 1A).

Next, as shown in FIG. 3B, the second housing 3 is moved along the direction of the arrow L2, so that the second housing 3 can correspond to the first housing 2 and the connector 1. Herein, the second housing 3 is not completely and tightly engaged with the first housing 2 (see FIG. 2B). Specifically, the third width W5 between the first stop portion 331 of the first connect board 33 and the second stop portion 351 of the second connect board 35 is less than the width W6 of the connector 1, so that the first stop portion 331 and the second stop portion 351 can have deformation when the second housing 3 moves toward the connector 1 along the direction of the arrow L2 and the first stop portion 331 and the second stop portion 351 contact against one end of the connector 1 facing the second cover board 31. This design can make the second housing 3 closer to the first housing 2 so as to form the status of FIG. 2B.

Finally, as shown in FIG. 2B, the second housing 3 is moved along the direction of the arrow L1, so that the second housing 3 can be disposed corresponding to the first housing 2 and the connector 1 (see FIG. 2A). Specifically, after moving the second housing 3 along the direction of the arrow L1, the connect hooks 34 of the second housing 3 can engage with the bumps 25 of the first housing 2 for restricting the displacements of the second housing 3 toward the right, up and down sides of the figure, the first connect blocks 311 of the second housing 3 can engage with the first connect holes 222 of the first housing 2 for restricting the displacements of the second housing 3 toward the right, up and down sides of the figure, the second connect blocks 3211 of the second housing 3 can engage with the second connect holes 2311 of the first housing 2 for restricting the displacements of the second housing 3 toward the left, right, up and down sides of the figure, the connect grooves 312 of the second housing 3 can engage with the third connect blocks 2711 of the first housing 2 for restricting the displacements of the second housing 3 toward the left and down sides of the figure, the contact block 313 of the second housing 3 can engage with the output sideboard 27 of the first housing 2 for restricting the displacement of the second housing 3 toward the right side of the figure (from the status of FIG. 2B to the status of FIG. 2A), and the first stop portion 331 and the second stop portion 351 of the second housing 3 do not contact against the end of the connector 1 facing the second cover board 31 and are recovered to the original non-deformed status to contact against the end of the connector 1 away from the first sideboard 22 for restricting the displacement of the second housing 3 toward the left side of the figure (from the status of FIGS. 2B and 3B to the status of FIGS. 2A and 3A). This embodiment provides various connecting structure designs of the first housing 2 and the second housing 3, so that the first housing 2 and the second housing 3 can be tightly connected after the assembling procedure (the displacement of the second housing 3 with respect to the first housing 2 can be prevented).

In summary, in the housing structure 100 of this disclosure, the connect hooks 34 of the second housing 3 can engage with the bumps 25 of the first housing 2, the first connect blocks 311 of the second housing 3 can engage with the first connect holes 222 of the first housing 2, the second connect blocks 3211 of the second housing 3 can engage with the second connect holes 2311 of the first housing 2, the connect grooves 312 of the second housing 3 can engage with the third connect blocks 2711 of the first housing 2, the contact block 313 of the second housing 3 can engage with the output sideboard 27 of the first housing 2, and the first stop portion 331 and the second stop portion 351 of the second housing 3 contact against the end of the connector 1 away from the first sideboard 22, so that the first housing 2 and the second housing 3 can be tightly connected after the assembling procedure. Accordingly, the displacement of the second housing 3 with respect to the first housing 2 can be prevented. Therefore, the housing structure of this disclosure can firmly fix two housings and maintain the connecting status under external forces, thereby preventing the detachment of the housings. In addition, this disclosure does not need to fix the housings by other approaches (e.g. ultrasonic welding or screwing), can easily assemble the housings, and can save the production cost.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A housing structure, comprising:
   a connector,
   a first housing comprising:
      a first cover board,
      a first sideboard connected to the first cover board, wherein the connector is exposed from the first sideboard,
      two second sideboards connected to the first cover board and two ends of the first sideboard,
      a plurality of first recesses disposed at sides of the second sideboards away from the first cover board, and
      a plurality of bumps disposed in the first recesses, respectively, wherein a gap is formed between each of the bumps and a side wall of the corresponding first recess closest to the first cover board; and
   a second housing comprising:
      a second cover board,
      two third sideboards connected to the second cover board and corresponding to the second sideboards,
      a first connect board disposed on the second cover board and contacting against an end of the connector away from the first sideboard, the first connect board being in parallel with the third sideboards, and
      a plurality of connect hooks protruded from one sides of the third sideboards away from the second cover board for engaging with the bumps.

2. The housing structure according to claim 1, wherein each of the connect hooks comprises a connecting portion and a boot portion, one end of each of the connecting portions is connected to each of the third sideboards, the other end of each of the connecting portions is connected to each of the boot portions, an opening is formed between each of the boot portions and the side of the third sideboard away from the second cover board, the boot portions are disposed corresponding to the gaps, and the openings are disposed along a direction away from the first sideboard.

3. The housing structure according to claim 2, wherein each of the boot portions has a first width, each of the openings has a second width, the first width is equal to a width of the gap, and the second width is equal to a width of each of the bumps.

4. The housing structure according to claim 1, wherein the second housing further comprises a second connect board disposed on the second cover board and contacting against one end of the connector away from the first sideboard.

5. The housing structure according to claim 4, wherein the first connect board has a first stop portion, the second connect board has a second stop portion, and the first connect board and the second connect board contact against one end of the connector away from the first sideboard by the first stop portion and the second stop portion.

6. The housing structure according to claim 5, wherein a third width is defined between the first stop portion and the second stop portion, and the third width is less than a width of the connector.

7. The housing structure according to claim 6, wherein the first housing comprises a fixing base connecting to the first sideboard and the first cover board and disposed corresponding to the connector.

8. The housing structure according to claim 7, wherein the connector has a connect rail disposed around a surface of the connector, and the first sideboard has a connect slot disposed corresponding to the connect rail.

9. The housing structure according to claim 8, wherein the first sideboard has at least one first connect hole, the second cover board has at least one first connect block, and the at least one first connect block is disposed corresponding to the at least one first connect hole.

10. The housing structure according to claim 9, wherein the first housing further comprises an output sideboard connected to the first cover board, each of the second sideboards has a coupling board coupling to two ends of the output sideboard, each of the coupling board comprises a second connect hole, each of the third sideboard has a second recess disposed corresponding to the coupling board, and each of the second recesses has a second connect block disposed corresponding to each of the second connect hole.

11. The housing structure according to claim 10, wherein the output sideboard has a top surface, at least one third connect block is disposed on the top surface, the second cover board has a connect groove disposed corresponding to the top surface, and the connect groove is configured to accommodate the at least one third connect block.

12. The housing structure according to claim 11, wherein the second cover board further comprises at least one contact block disposed corresponding to the output sideboard, and the at least one contact block contacts against the output sideboard.

13. A housing structure, comprising:
a connector;
a first housing comprising:
   a first cover board,
   a first sideboard connected to the first cover board, wherein the connector is exposed from the first sideboard,
   two second sideboards connected to the first cover board and two ends of the first sideboard,
   a plurality of first recesses disposed at sides of the second sideboards away from the first cover board, and
   a plurality of bumps disposed in the first recesses, respectively, wherein a gap is formed between each of the bumps and a side wall of the corresponding first recess closest to the first cover board; and
a second housing where the connector is fixed, comprising:
   a second cover board,
   two third sideboards connected to the second cover board and corresponding to the second sideboards,
   a first connect board disposed on the second cover board and contacting against an end of the connector away from the first sideboard, the first connect board being in parallel with the third sideboards,
   a second connect board disposed on the second cover board in parallel with the third sideboards and contacting against one end of the connector away from the first sideboard, and
   a plurality of connect hooks protruded from one sides of the third sideboards away from the second cover board for engaging with the bumps,
   wherein the first connect board has a first stop portion, the second connect board has a second stop portion, a third width is defined between the first stop portion and the second stop portion, and the third width is less than a width of the connector, the first stop portion and the second stop portion contact against one end of the connector away from the first sideboard and then have deformation so that the second housing is closer to the first housing.

14. The housing structure according to claim 13, wherein the first housing comprises:
   an output sideboard connected to the first cover board, each of the second sideboards coupling to two ends of the output sideboard,
   wherein in a direction from the first cover board to the second cover board, the output sideboard is higher than the first sideboard and the second sideboards, the third sideboards and the second cover board define an opening at an end of the second cover board away from the first connect board, the output sideboard covers the opening.

15. A housing structure, comprising:
a connector,
a first housing comprising:
   a first cover board,
   a first sideboard connected to the first cover board, wherein the connector is exposed from the first sideboard,
   two second sideboards connected to the first cover board and two ends of the first sideboard,
   an output sideboard connected to the first cover board, each of the second sideboards coupling to two ends of the output sideboard,
   a plurality of first recesses disposed at sides of the second sideboards away from the first cover board, and
   a plurality of bumps disposed in the first recesses, respectively, wherein a gap is formed between each of the bumps and a side wall of the corresponding first recess closest to the first cover board; and
a second housing comprising:
   a second cover board,
   two third sideboards connected to the second cover board and corresponding to the second sideboards,
   a first connect board disposed on the second cover board and contacting against an end of the connector away from the first sideboard, and
   a plurality of connect hooks protruded from one sides of the third sideboards away from the second cover board for engaging with the bumps,
   wherein in a direction from the first cover board to the second cover board, the output sideboard is higher than the first sideboard and the second sideboards, the third sideboards and the second cover board define an opening at an end of the second cover board away from the first connect board, the output sideboard covers the opening.

* * * * *